United States Patent
Lee et al.

(10) Patent No.: US 9,306,049 B2
(45) Date of Patent: Apr. 5, 2016

(54) HETERO JUNCTION FIELD EFFECT TRANSISTOR AND METHOD FOR MANUFACTURING THE SAME

(71) Applicant: Samsung Electronics Co., Ltd., Suwon-si (KR)

(72) Inventors: JaeHoon Lee, Suwon-si (KR); Chanho Park, Seongnam-si (KR); NamYoung Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/062,284

(22) Filed: Oct. 24, 2013

(65) Prior Publication Data

US 2014/0138747 A1    May 22, 2014

(30) Foreign Application Priority Data

Nov. 22, 2012    (KR) ........................ 10-2012-0133194

(51) Int. Cl.
| | |
|---|---|
| *H01L 29/66* | (2006.01) |
| *H01L 29/778* | (2006.01) |
| *H01L 29/423* | (2006.01) |
| *H01L 29/06* | (2006.01) |
| *H01L 29/10* | (2006.01) |
| *H01L 29/20* | (2006.01) |

(52) U.S. Cl.
CPC .......... *H01L 29/778* (2013.01); *H01L 29/0607* (2013.01); *H01L 29/1029* (2013.01); *H01L 29/42316* (2013.01); *H01L 29/66462* (2013.01); *H01L 29/7787* (2013.01); *H01L 29/2003* (2013.01)

(58) Field of Classification Search
CPC .................................................. H01L 29/778
USPC ........................................................ 257/194
See application file for complete search history.

(56) References Cited

U.S. PATENT DOCUMENTS

| | | | |
|---|---|---|---|
| 7,038,253 | B2 | 5/2006 | Yoshida et al. |
| 7,326,971 | B2 | 2/2008 | Harris et al. |
| 7,425,721 | B2 | 9/2008 | Teraguchi |
| 7,615,452 | B2 | 11/2009 | Sato |
| 7,859,017 | B2 | 12/2010 | Sato |
| 7,910,464 | B2 | 3/2011 | Murata et al. |
| 7,955,983 | B2 | 6/2011 | Imer et al. |
| 8,043,906 | B2 | 10/2011 | Beach |
| 8,653,559 | B2 * | 2/2014 | Corrion et al. ................ 257/192 |
| 2005/0133818 | A1 * | 6/2005 | Johnson et al. ................ 257/192 |
| 2005/0145883 | A1 * | 7/2005 | Beach ................ H01L 29/7835 257/194 |

(Continued)

FOREIGN PATENT DOCUMENTS

| | | |
|---|---|---|
| JP | 2001102354 | 4/2001 |
| JP | 2008053450 | 3/2008 |

(Continued)

*Primary Examiner* — Matthew Landau
*Assistant Examiner* — Igwe U Anya
(74) *Attorney, Agent, or Firm* — Onello & Mello, LLP

(57) ABSTRACT

Hetero junction field effect transistors and methods of fabricating such transistors are disclosed wherein: a first compound semiconductor layer is provided on a substrate; a second compound semiconductor layer is provided on the first compound semiconductor layer; a gate insulating layer is provided on the second compound semiconductor layer; and a gate electrode is provided on the gate insulating layer such that the gate insulating layer penetrates the second compound semiconductor layer so as to be in contact with the first compound semiconductor layer.

6 Claims, 10 Drawing Sheets

(56) References Cited

U.S. PATENT DOCUMENTS

| | | | |
|---|---|---|---|
| 2007/0152238 A1* | 7/2007 | Matocha et al. | 257/192 |
| 2008/0093626 A1* | 4/2008 | Kuraguchi | H01L 29/2003 257/190 |
| 2008/0258243 A1* | 10/2008 | Kuroda et al. | 257/410 |
| 2009/0008676 A1 | 1/2009 | Sato | |
| 2010/0012978 A1 | 1/2010 | Sato | |
| 2010/0025730 A1* | 2/2010 | Heikman et al. | 257/194 |
| 2010/0129992 A1* | 5/2010 | Murata | H01L 21/28 438/478 |
| 2010/0301393 A1 | 12/2010 | Teraguchi | |
| 2011/0006346 A1* | 1/2011 | Ando et al. | 257/192 |
| 2012/0061680 A1 | 3/2012 | Lee et al. | |
| 2013/0037868 A1* | 2/2013 | Okamoto et al. | 257/288 |

FOREIGN PATENT DOCUMENTS

| | | |
|---|---|---|
| JP | 2008210836 | 9/2008 |
| JP | 2009016655 | 1/2009 |
| JP | 2009076845 | 4/2009 |
| KR | 1020090029897 | 3/2009 |
| KR | 20120027988 | 3/2012 |

* cited by examiner

HETERO JUNCTION FIELD EFFECT TRANSISTOR AND METHOD FOR MANUFACTURING THE SAME

CROSS-REFERENCE TO RELATED APPLICATIONS

This U.S. non-provisional patent application claims priority under 35 U.S.C. §119 to Korean Patent Application No. 10-2012-0133194, filed on Nov. 22, 2012, the entirety of which is incorporated by reference herein.

BACKGROUND

The inventive concept relates generally to a hetero junction field effect transistor and to a method for manufacturing the same; and, more particularly, the inventive concept relates to a hetero junction field effect transistor that comprises a compound semiconductor and to a method for manufacturing the same.

Recently, communication techniques for high speed and high capacity signal transmission have been rapidly developed with the rapid development of info-communication fields. In particular, as the demands for personal portable phones, satellite communications, military radar, broadcasting communications, and repeaters for communications have grown in wireless communication fields, so too have the demands for the high speed and high power electronic devices, that are key components in high speed info-communication systems of microwave and millimeter-wave bands, increasingly grown.

A hetero junction field effect transistor (HFET) is representative of such a high power electronic device. The HFET is also called 'a high electron mobility transistor (HEMT)'. The HFET may be used in fields using a high voltage, so that it may advantageously have a high breakdown voltage. A size of the HFET may be reduced while the HFET has a great power density. A semiconductor having a wide band gap (e.g., a compound semiconductor) may be used in fabricating the HFET in order that the HFET has the desired high breakdown voltage. Additionally, the HFET may advantageously have high heat conductivity. Accordingly, a cooling system for the HFET may be reduced in size. Moreover, the HFET may also advantageously have a larger saturated electron drift velocity. Thus, the HFET may better perform a high speed operation such as a high speed switching operation. For example, the HFET may have a higher operating frequency.

An electron mobility of silicon, as generally used in semiconductor devices, is too low to cause a high source resistance. Thus, research is being conducted for techniques of applying semiconductors based on III-V group compounds to the fabrication of HEMT structures. In particular, a gallium nitride-based compound has a relatively wide band gap, a high electron saturation velocity, and high chemical stability. Thus, the gallium nitride-based compound is attractive as a material for the fabrication of an HEMT. Research is also being conducted on techniques of using transistors based on such gallium nitride compounds in high temperature, high power, and high frequency electronic devices.

SUMMARY

Embodiments of the inventive concept may provide hetero junction field effect transistors capable of reducing on-resistance dispersion and threshold voltage dispersion.

Embodiments of the inventive concept may also provide methods for easily manufacturing a hetero junction field effect transistor for a normally off-state condition.

In one aspect, a hetero junction field effect transistor may include: a first compound semiconductor layer on a substrate; a second compound semiconductor layer on the first compound semiconductor layer; a gate insulating layer on the second compound semiconductor layer; and a gate electrode on the gate insulating layer. The gate insulating layer may penetrate the second compound semiconductor layer so as to be in contact with the first compound semiconductor layer.

In an embodiment, a surface of the first compound semiconductor layer, which is in contact with the gate insulating layer, may expose a R-plane.

In an embodiment, the first compound semiconductor layer may include a recess region formed in an upper portion of the first compound semiconductor layer whereby the recess region may extend along the gate electrode and the gate insulating layer may extend into the recess region.

In an embodiment, a sidewall of the first compound semiconductor layer, which defines the recess region, may expose a R-plane.

In an embodiment, the recess region may have a V-shape; and a width of the V-shaped recess region may be substantially equal to or less than half of a width of the gate electrode.

In an embodiment, the first compound semiconductor layer may include a protrusion provided on the first compound semiconductor layer whereby the protrusion may extend along the gate electrode and the gate insulating layer may be in contact with the protrusion.

In an embodiment, a sidewall of the first compound semiconductor layer, which defines the protrusion, may expose a R-plane.

In an embodiment, the protrusion may have a reverse V-shape; and a width of the reverse V-shaped protrusion may be substantially equal to or less than half of a width of the gate electrode.

In an embodiment, the first compound semiconductor layer may include gallium nitride (GaN); the second compound semiconductor layer may include aluminum-gallium nitride (AlGaN); and a sidewall of the first compound semiconductor layer, which is in contact with the gate insulating layer, may be inclined at an inclination angle of about 50 degrees to about 70 degrees relative to a top surface of the substrate.

In an embodiment, a 2-dimensional electron gas (2DEG) region may be provided in an upper portion of the first compound semiconductor layer in a state such that a voltage is not applied to the gate electrode; however, the 2DEG region may not be provided under a contacting portion of the gate insulating layer and the first compound semiconductor layer.

In another aspect, a method for manufacturing a hetero junction field effect transistor may include: forming a first compound semiconductor layer on a substrate; forming a recess region or a protrusion at an upper portion of the first compound semiconductor layer; growing a second compound semiconductor layer on the first compound semiconductor layer; forming a gate insulating layer on the second compound semiconductor layer; and forming a gate electrode on the gate insulating layer. The second compound semiconductor layer may be selectively grown on a top surface of the first compound semiconductor layer, except not in a region where the recess region or the protrusion is formed.

In an embodiment, forming the recess region may include: etching the upper portion of the first compound semiconductor layer so as to expose a R-plane.

In an embodiment, forming the protrusion may include: forming a mask pattern on the first compound semiconductor layer; and performing an epitaxial growth process on the portion of the first compound semiconductor layer that is left exposed by the mask pattern.

In an embodiment, forming the protrusion may include: forming a mask pattern having the same shape as the protrusion on the first compound semiconductor layer; and performing an etching process using the mask pattern as an etch mask to transfer the shape of the mask pattern to the upper portion of the first compound semiconductor layer.

In an embodiment, a sidewall of the recess region or a sidewall of the protrusion may expose a R-plane; and the gate insulating layer may be in contact with the recess region or the protrusion.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
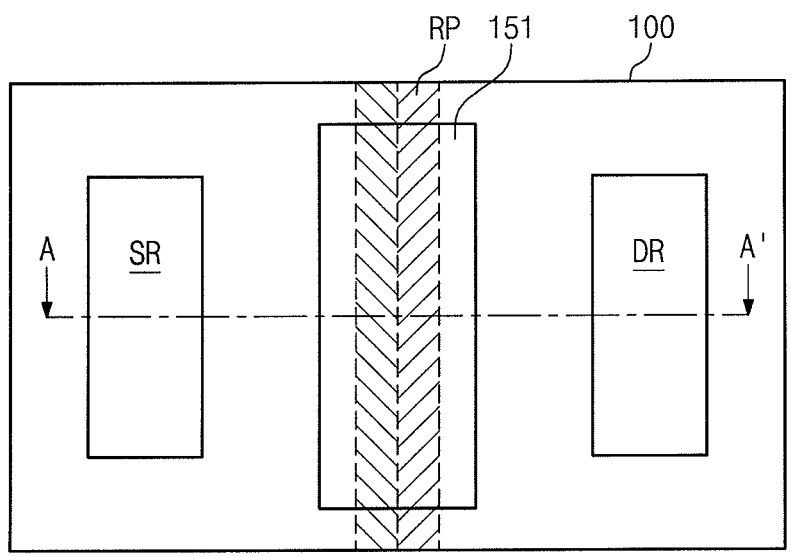
FIG. 1 is a schematic plan view illustrating a hetero junction field effect transistor according to embodiments of the inventive concept.
Figure 1:
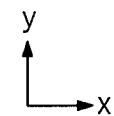

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and it may be implemented in various forms. Accordingly, the exemplary embodiments are provided only to disclose the inventive concept and to let those skilled in the art know the category of the inventive concept. In the drawings, embodiments of the inventive concept are not limited to the specific examples provided herein and are exaggerated in some places and in some dimensions for better clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. However, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will also be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to schematic cross-sectional illustrations and/or plane illustrations that are idealized exemplary illustrations. However, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the various embodiments.

Figure 2:
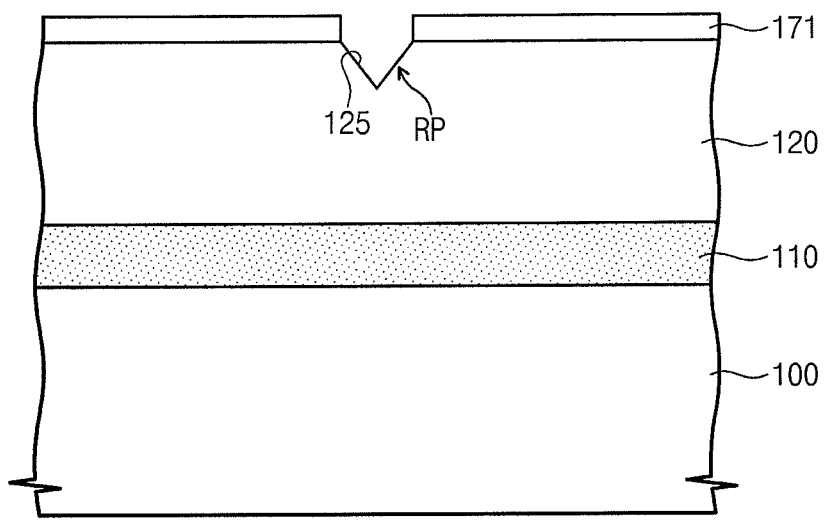
FIGS. 2 to 4 are schematic cross-sectional views taken along a line A-A' of FIG. 1 to illustrate a method for manufacturing a hetero junction field effect transistor according to some embodiments of the inventive concept.
Figure 3:
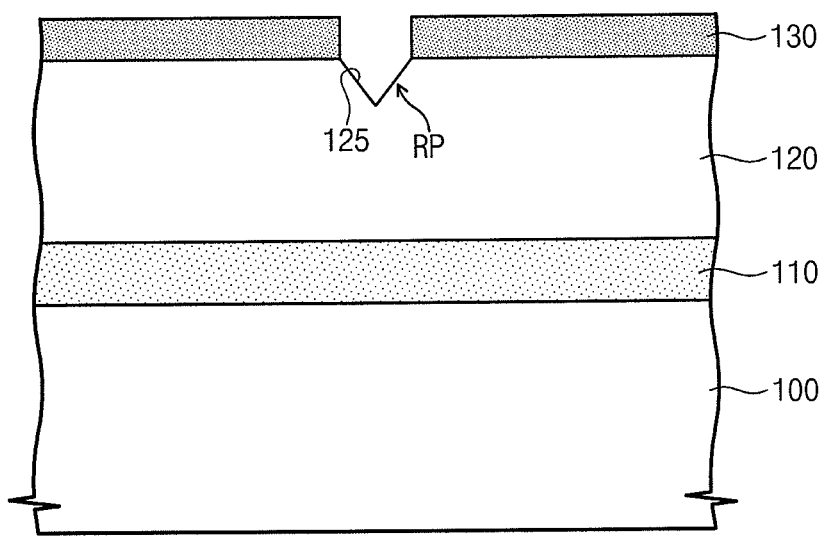
Figure 4:
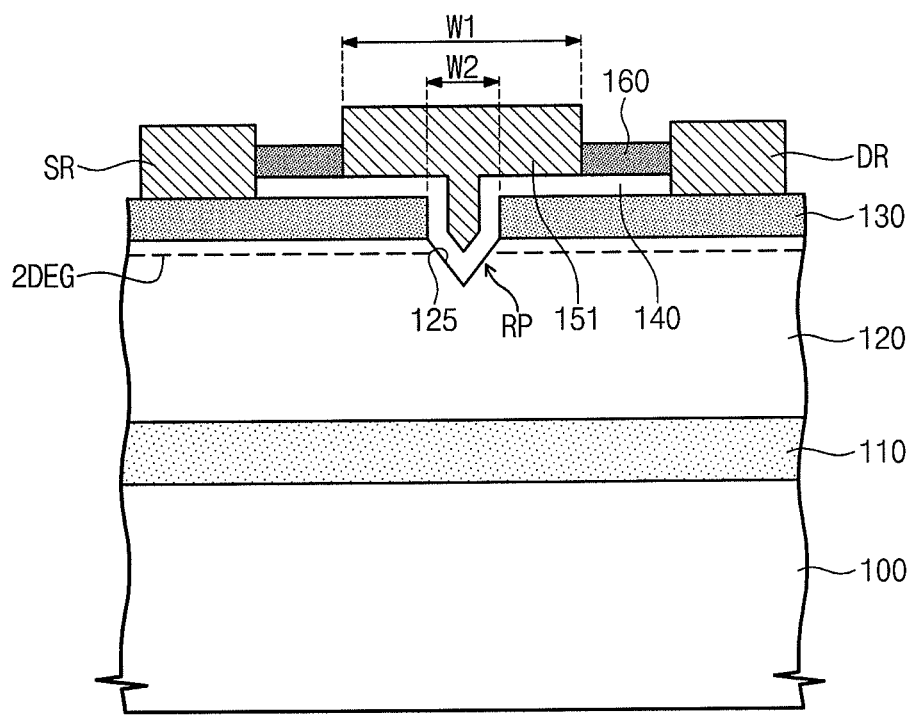
Figure 5:
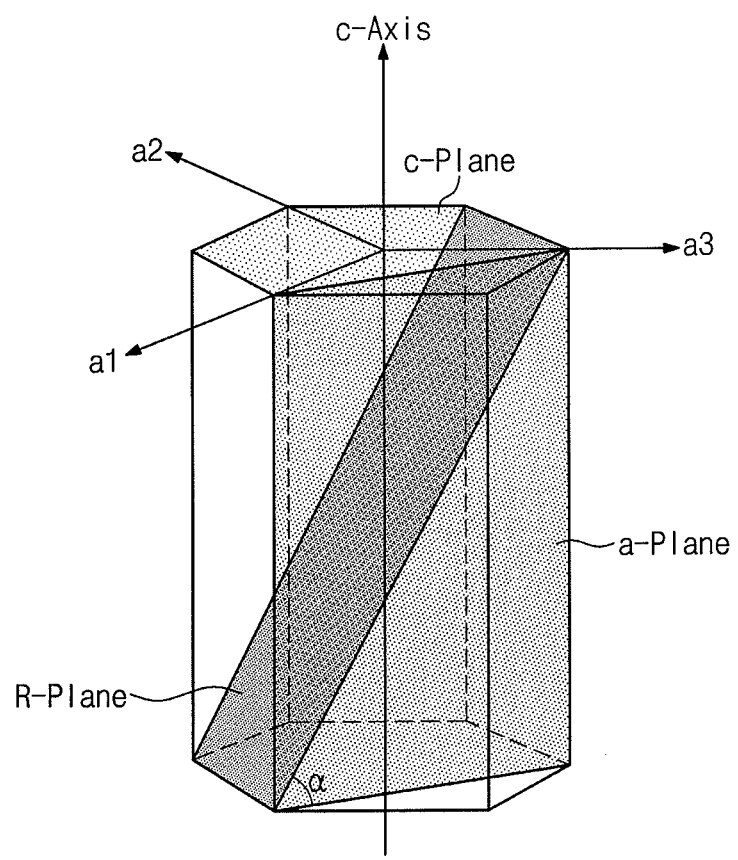
FIG. 5 is a schematic perspective view illustrating a crystal structure of a first compound semiconductor layer.

FIG. 1 is a schematic plan view illustrating a hetero junction field effect transistor according to some embodiments of the inventive concept. FIGS. 2 to 4 are schematic cross-sectional views taken along a line A-A' of FIG. 1 to illustrate a method for manufacturing a hetero junction field effect transistor according to these embodiments of the inventive concept. FIG. 5 is a schematic perspective view illustrating a crystal structure of a first compound semiconductor layer.

Referring to FIGS. 1 and 2, a buffer layer 110 and a first compound semiconductor layer 120 may be sequentially formed on a substrate 100. The substrate 100 may be a sapphire substrate, a silicon-carbon (SiC) substrate, a silicon substrate, an aluminum nitride (AlN) substrate, or a gallium nitride (GaN) substrate. The first compound semiconductor layer 120 may be, for example, a gallium nitride (GaN) layer, a gallium arsenide (GaAs) layer, or an indium nitride (InN)

layer. In an embodiment, the first compound semiconductor layer 120 may be formed to have a thickness of about 2 μm to about 6 μm. The buffer layer 110 may relieve a stress caused by lattice constant differences and/or by thermal expansion coefficient differences between the substrate 100 and the first compound semiconductor layer 120. Thus, the buffer layer 110 may prevent a crystal property of the first compound semiconductor layer 120 from deteriorating over time. The buffer layer 110 may, for example, be a low temperature gallium nitride (GaN) buffer layer. The buffer layer 110 and the first compound semiconductor layer 120 may be sequentially formed on the substrate 100 by a metal-organic chemical vapor deposition (MOCVD) method or a molecular beam epitaxy (MBE) method.

An upper surface discontinuity region formed by a geometric feature, such as the recess region 125, may be formed in an upper portion of the first compound semiconductor layer 120. The recess region 125 may have a linear shape extending in a first direction (e.g., a y-axis direction) in a plan view. In an embodiment, the recess region 125 may have a generally V-shaped cross section. However, the inventive concept is not limited thereto.

In an embodiment, the recess region 125 may have a width of about 10 nm (nanometer) to about 5 μm (micrometer) and a height of about 10 nm to about 500 nm. A sidewall of the first compound semiconductor layer 120, which defines the recess region 125, may expose a R-plane RP of the first compound semiconductor layer 120. The R-plane RP may be inclined at an inclination angle of about 50 degrees to about 70 degrees relative to a top surface of the substrate 100. The R-plane RP will be described in more detail hereinafter.

FIG. 5 is a schematic perspective view illustrating a crystal structure of the first compound semiconductor layer 120. The crystal structure of the first compound semiconductor layer 120 may be a Wurtzite structure, which is one kind of hexagonal close packed crystal structure. A unit cell of the hexagonal close packed crystal structure may be defined by an a1-axis, an a2-axis, and an a3-axis, all in the same plane, and also by a c-axis that is perpendicular to the plane of the a1-axis, a2-axis, and a3-axis. The hexagonal close packed crystal structure may include a c-plane (0001), an a-plane (11$\bar{2}$0), and a R-plane (10$\bar{1}$2) based on the unit cell. The R-plane makes an angle α relative to the c-plane (or relative to another plane that is parallel to the c-plane). In an embodiment, the angle α of gallium nitride may be within a range of about 50 degrees to about 70 degrees.

Referring again to FIG. 2, the recess region 125 may be formed using a photolithography process. In an embodiment, after a mask pattern 171 is formed on the first compound semiconductor layer 120, an anisotropic etching process may be performed using the mask pattern 171 as an etch mask on the first compound semiconductor layer 120. The anisotropic etching process may include a wet etching process and/or a dry etching process. The anisotropic etching process may use a plurality of mask patterns. In an embodiment, the anisotropic etching process for the formation of the recess region 125 may include a wet etching process using an etching solution including KOH.

Referring to FIGS. 1 and 3, a second compound semiconductor layer 130 may be formed on the first compound semiconductor layer 120 having the recess region 125. In an embodiment, the second compound semiconductor layer 130 may be formed to have a thickness of about 10 nm to about 50 nm. Before the second compound semiconductor layer 130 is formed, a removal process to remove the mask pattern 171 may be performed; and, then a cleaning process may be performed on the first compound semiconductor layer 120 having the recess region 125. The second compound semiconductor layer 130 may include a material that forms a hetero junction with the first compound semiconductor layer 120. For example, the second compound semiconductor layer 130 may include an aluminum-gallium nitride (AlGaN) layer, an aluminum-gallium arsenide (AlGaAs) layer, or an aluminum-indium nitride (AlInN) layer. The second compound semiconductor layer 130 may be formed by an epitaxial growth process using the first compound semiconductor layer 120 as a seed layer.

When the first compound semiconductor layer 120 has a hexagonal close packed crystal structure (as described above in connection with FIG. 5), a growth rate on the c-plane may be dominant and a growth rate on the R-plane may be relatively very low. This is because atoms of the compound semiconductor layer are relatively unstably arranged in the R-plane. Thus, when the second compound semiconductor layer 130 is grown from the first compound semiconductor layer 120, the second compound semiconductor layer 130 may not be formed in the recess region 125 that exposes the R-plane RP. Instead, the second compound semiconductor layer 130 may be selectively formed only along a top surface of the first compound semiconductor layer 120, but not along an inner surface of the recess region 125. As a result, the second compound semiconductor layer 130 may be formed to leave the recess region 125 exposed. In an embodiment, a thickness of the second compound semiconductor layer 130 may be about 300 Å or less.

Referring to FIGS. 1 and 4, a gate insulating layer 140 and a gate electrode 151 may be sequentially formed on the second compound semiconductor layer 130 and above the recess region 125. The gate insulating layer 140 may include, for example, aluminum oxide ($Al_2O_3$). The gate electrode 151 may include, for example, a metal (e.g., tungsten, titanium, hafnium, and/or copper) and/or any conductive metal nitride thereof. The gate insulating layer 140 and the gate electrode 151 may be formed using a chemical vapor deposition (CVD) process or a sputtering process.

A source electrode SR and a drain electrode DR may be formed, respectively, along different sides of the gate electrode 151. Selected portions of the gate insulating layer 140 may be removed to expose portions of the second compound semiconductor layer 130; and, thereafter the source and drain electrodes SR and DR, respectively, may be formed on the exposed portions of the second compound semiconductor layer 130. Thus, the source and drain electrodes SR and DR may be in ohmic-contact with the second compound semiconductor layer 130. The source electrode SR and the drain electrode DR may be formed simultaneously with the gate electrode 151. In an embodiment, after the selected portions of the gate insulating layer 140 are removed, a conductive layer (not shown) may be formed on the remaining gate insulating layer 140. The conductive layer may be patterned to form the gate electrode 151, the source electrode SR and the drain electrode DR.

A protecting layer 160 may be formed to cover the portions of the gate insulating layer 140 that are left exposed between the gate electrode 151 and the source electrode SR or the drain electrode DR. For example, the protecting layer 160 may include a silicon nitride layer or a silicon oxynitride layer.

The hetero junction field effect transistor according to some embodiments of the inventive concept will now be described with reference to FIGS. 1 and 4. The hetero junction field effect transistor may include a buffer layer 110, a first compound semiconductor layer 120, and a second compound semiconductor layer 130 that are sequentially stacked on a substrate 100. The substrate 100 may be a sapphire substrate, a silicon-carbon (SiC) substrate, a silicon substrate, an aluminum nitride (AlN) substrate, or a gallium nitride (GaN) substrate. The first compound semiconductor layer 120 may be, for example, a gallium nitride (GaN) layer, a gallium arsenide (GaAs) layer, or an indium nitride (InN) layer. In an embodiment, the first compound semiconductor layer 120 may be an undoped gallium nitride (GaN) layer or a gallium nitride (GaN) layer doped with impurities such as magnesium (Mg), zinc (Zn), carbon (C), or iron (Fe). For example, the buffer layer 110 may be a low temperature gallium nitride (GaN) buffer layer. The second compound semiconductor layer 130 may include a material that forms a hetero junction with the first compound semiconductor layer 120. For example, the second compound semiconductor layer 130 may include an aluminum-gallium nitride (AlGaN) layer, an aluminum-gallium arsenide (AlGaAs) layer, or an aluminum-indium nitride (AlInN) layer.

A recess region 125 may be provided in an upper portion of the first compound semiconductor layer 120 in accordance with the previous description. The recess region 125 may have a linear shape extending in a y-axis direction in a plan view. A sidewall of the first compound semiconductor layer 120 that defines the recess region 125 may expose a R-plane RP of the first compound semiconductor layer 120.

A gate insulating layer 140 and a gate electrode 151 may be sequentially provided on the second compound semiconductor layer 130. A source electrode SR and a drain electrode DR may be provided, respectively, along different sides of the gate electrode 151, again as previously described.

As seen in FIG. 4, the gate insulating layer 140 may penetrate the second compound semiconductor layer 130 at the recess region 125, so as to be in contact with the R-plane RP of the first compound semiconductor layer 120. Thus, the gate electrode 151 may also penetrate the second compound semiconductor layer 130 and also extend into the recess region 125.

A hetero junction structure of the second compound semiconductor layer 130 and the first compound semiconductor layer 120 may include a 2-dimensional electron gas (2DEG) region (as seen in FIG. 4) provided in an interface between the second and first compound semiconductor layers 130 and 120. In more detail, the 2DEG region may be provided in an upper portion of the first compound semiconductor layer 120. If the 2DEG region extends between a region under the source electrode SR and a region under the drain electrode DR in the state where a voltage is not applied to the gate electrode 151, then the hetero junction field effect transistor may be in a normally on-state. In this case, a power consumption of a power device that incorporates such a hetero junction field effect transistor may increase.

According to embodiments of the inventive concept, however, the 2DEG region may be divided into two separate regions under the gate electrode 151 by the recess region 125 and the portion of the gate insulating layer 140 in the recess region 125. In other words, the 2DEG region may not be disposed under a contacting portion of the first compound semiconductor layer 120 and the gate insulating layer 140 in the state where a voltage is not applied to the gate electrode 151. As a result, the hetero junction field effect transistor may maintain a normally off-state condition in the state where a voltage is not applied to the gate electrode 151. On the other hand, if an on-voltage is applied to the gate electrode 151, a 2DEG region may be induced to extend under the recess region 125, such that the hetero junction field effect transistor may then be in an on-state condition.

According to embodiments of the inventive concept, a width W2 of the recess region 125 may advantageously be substantially equal to or less than half of a width W1 of the gate electrode 151. Since the 2DEG region is divided into separate regions by a relatively narrow recess region, a resistance when the on-voltage is applied (e.g., an on-resistance) may be reduced.

According to embodiments of the inventive concept, a normally off-state hetero junction field effect transistor may be manufactured without a process of etching the second compound semiconductor layer 130. If the hetero junction field effect transistor having the above structure is formed using a process of etching the second compound semiconductor layer 130, it may be difficult to control an etching thickness and an etching position of the second compound semiconductor layer 130, with the result that the on-resistance may not be uniform and a dispersion of a threshold voltage may increase. Therefore, according to some embodiments of the inventive concept, after the recess region 125 is formed in the upper portion of the first compound semiconductor layer 120, the growth process of the second compound semiconductor layer 130 may be performed to form the normally off-state hetero junction field effect transistor without a process of etching the second compound semiconductor layer 130.

FIGS. 6 to 9 are schematic cross-sectional views taken along a line A-A' of FIG. 1 to illustrate a method for manufacturing a hetero junction field effect transistor according to other embodiments of the inventive concept. The descriptions relating to the duplicated elements (i.e., elements already described above) will be omitted or mentioned only briefly for the purpose of ease and convenience in explanation.

Figure 6:
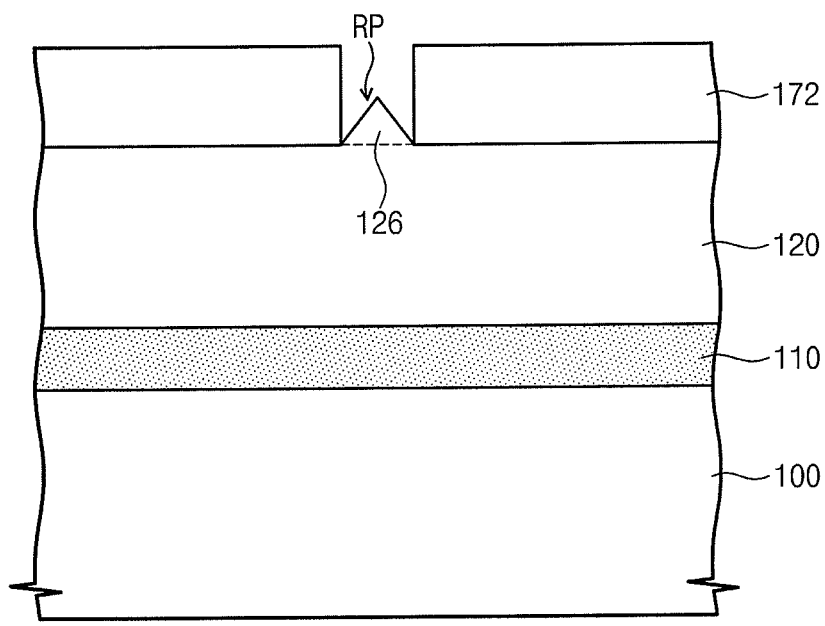
FIGS. 6 to 9 are schematic cross-sectional views taken along a line A-A' of FIG. 1 to illustrate a method for manufacturing a hetero junction field effect transistor according to other embodiments of the inventive concept.

Referring to FIG. 6, a buffer layer 110 and a first compound semiconductor layer 120 may be sequentially provided on a substrate 100. An upper surface discontinuity region formed by a geometric feature, in this case by the protrusion 126, may be formed on a top surface of the first compound semiconductor layer 120. The protrusion 126 is formed of the same material as the first compound semiconductor layer 120. The protrusion 126 may be formed by a homo-epitaxial growth process using the first compound semiconductor layer 120 as a seed layer. In an embodiment, a mask pattern 172 may be formed on the first compound semiconductor layer 120. Thereafter, a gallium nitride (GaN) layer may be grown from an exposed portion of the top surface of the first compound semiconductor layer 120, which portion is exposed by the mask pattern 172, thereby forming the protrusion 126. Hereinafter, the protrusion 126 will be described as a protrusion portion of the first compound semiconductor layer 120 in the present specification. The mask pattern 127 may be formed of, for example, silicon oxide. The protrusion 126 may expose a R-plane RP as shown in FIG. 6. In an embodiment, the R-plane RP may be inclined at an inclination angle of about 50 degrees to about 70 degrees relative to a top surface of the substrate 100. In an embodiment, the protrusion 126 may have an inverted V-shaped cross section (i.e., an upside-down "V"). When the protrusion 126 is formed by the homo-epitaxial growth process, a sidewall of the protrusion 126 may be inclined according to a crystallographic orientation property of the material. In other words, a vertical growth rate may be greater than a horizontal growth rate in the early part of the homo-epitaxial growth process, such that the protrusion 126 may be formed to have the inverted V-shaped cross section. In an embodiment, the protrusion 126 may have a width of about 10 nm to about 5 μm and a height of about 10 nm to about 500 nm. In an embodiment, the homo-epitaxial growth process may be performed under a pressure of about 200 Torr to about 400 Torr at a temperature of about 500 degrees Celsius to about 1300 degrees Celsius. However, the inventive concept is not limited to these parameters.

Figure 7:
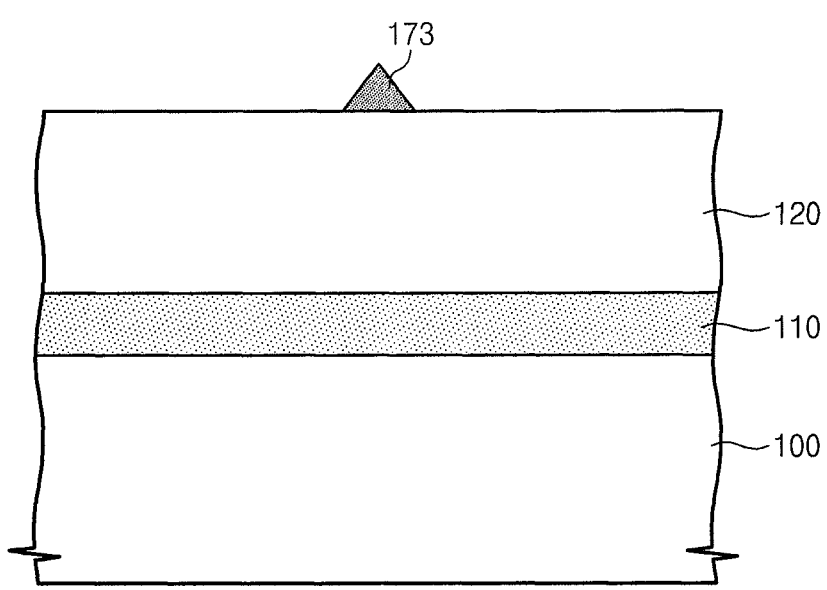

FIG. 7 is a schematic cross-sectional view illustrating a method of forming a protrusion similar to the protrusion 126 (as seen in FIG. 6) according to another embodiment of the inventive concept. In the FIG. 7 embodiment, forming the protrusion may include: forming a mask pattern 173 having the same shape as the protrusion 126 on the first compound semiconductor layer 120; and thereafter performing an etching process using the mask pattern 173 as an etch mask to transfer the shape of the mask pattern 173 to the upper portion of the first compound semiconductor layer 120. The mask pattern 173 may include a photoresist. In an embodiment, forming the mask pattern 173 may include: forming a photoresist pattern on the first compound semiconductor layer 120; and then transforming a shape of the photoresist pattern by a thermal reflow process.

Figure 8:
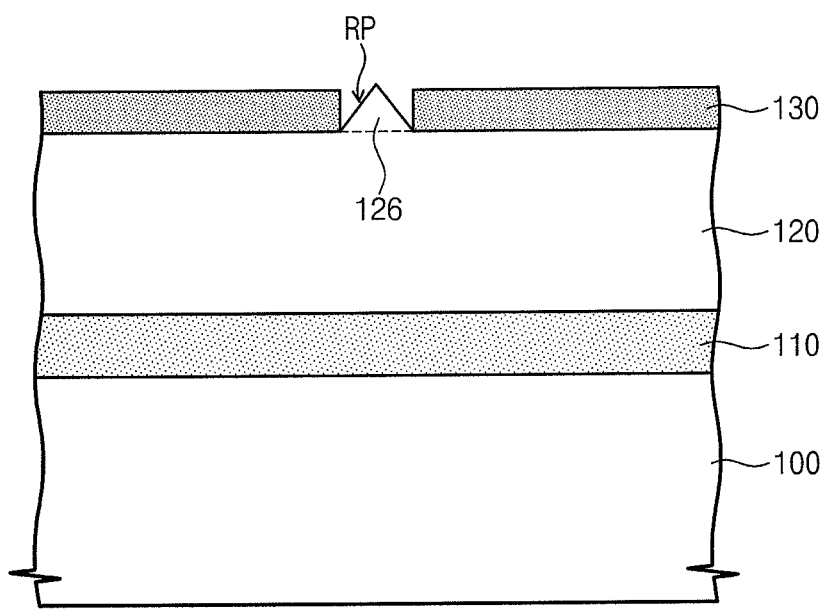

Referring to FIG. 8, a second compound semiconductor layer 130 may be formed on the first compound semiconductor layer 120 having the protrusion 126 (whether the protrusion is formed in accordance with FIG. 6 or FIG. 7). The sidewall of the protrusion 126 exposes the R-plane RP. Thus, for the reasons previously described, the second compound semiconductor layer 130, which is grown using the first compound semiconductor layer 120 as a seed layer, may not be formed on the protrusion 126. The second compound semiconductor layer 130 may have a thickness, for example, of about 10 nm to about 50 nm.

Figure 9:
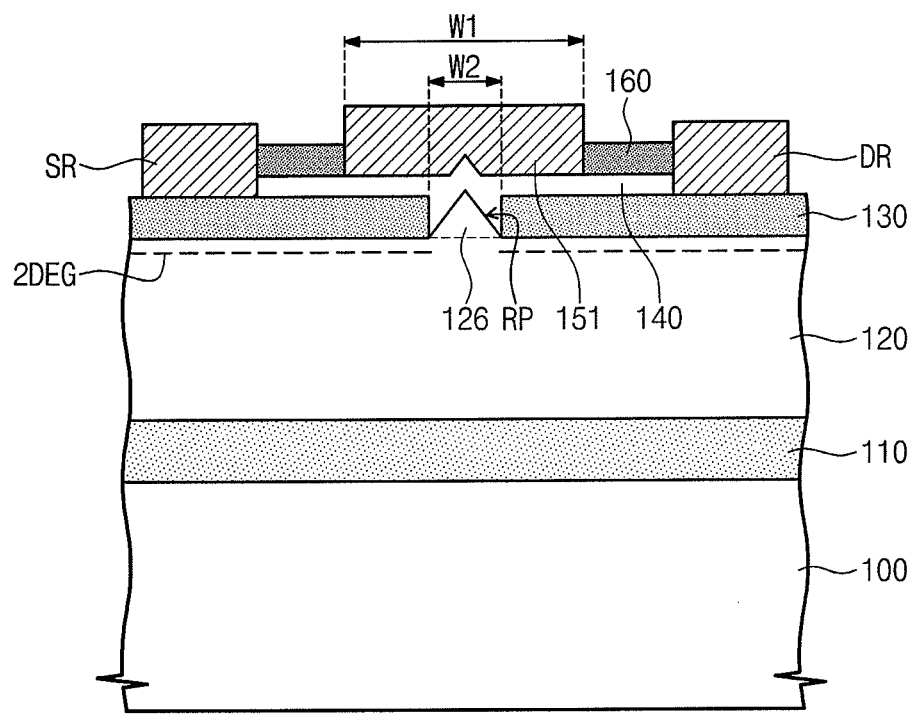

Referring to FIG. 9, a gate insulating layer 140 and a gate electrode 151 may be sequentially formed on the second compound semiconductor layer 130 and above the protrusion 126. A source electrode SR and a drain electrode DR may be formed, respectively, along different sides of the gate electrode 151. Subsequently, a protecting layer 160 may be formed to cover the portions of the gate insulating layer 140 that are left exposed between the gate electrode 151 and the source electrode SR or the drain electrode DR.

A hetero junction field effect transistor according to other embodiments of the inventive concept will now be described with reference to FIGS. 1 and 9. The hetero junction field effect transistor may include a buffer layer 110, a first compound semiconductor layer 120, and a second compound semiconductor layer 130 that are sequentially stacked on a substrate 100. The substrate 100 may be a sapphire substrate, a silicon-carbon (SiC) substrate, a silicon substrate, an aluminum nitride (AlN) substrate, or a gallium nitride (GaN) substrate. The first compound semiconductor layer 120 may be, for example, a gallium nitride (GaN) layer, a gallium arsenide (GaAs) layer, or an indium nitride (InN) layer. In an embodiment, the first compound semiconductor layer 120 may be an undoped gallium nitride (GaN) layer or a gallium nitride (GaN) layer doped with impurities such as magnesium (Mg), zinc (Zn), carbon (C), or iron (Fe). For example, the buffer layer 110 may be a low temperature gallium nitride (GaN) buffer layer. The second compound semiconductor layer 130 may include a material that forms a hetero junction with the first compound semiconductor layer 120. For example, the second compound semiconductor layer 130 may include an aluminum-gallium nitride (AlGaN) layer, an aluminum-gallium arsenide (AlGaAs) layer, or an aluminum-indium nitride (AlInN) layer.

A protrusion 126 may be provided on the first compound semiconductor layer 120 in accordance with the previous description. The protrusion 126 may have a linear shape extending in a y-axis direction in a plan view. A sidewall of the first compound semiconductor layer 120 that defines the protrusion 126 may expose a R-plane RP of the first compound semiconductor layer 120.

A gate insulating layer 140 and a gate electrode 151 may be sequentially provided on the second compound semiconductor layer 130. A source electrode SR and a drain electrode DR may be provided, respectively, along different sides of the gate electrode 151, again as previously described.

As seen in FIG. 9, the gate insulating layer 140 may penetrate the second compound semiconductor layer 130 along the sides of protrusion 126, so as to be in contact with the R-plane RP of the first compound semiconductor layer 120. In other words, a portion of the gate insulating layer 140 may be in contact with the protrusion 126 exposing the R-plane RP. The gate insulating layer 140 may fill a region between the second compound semiconductor layer 130 and the protrusion 126. As a result, the gate insulating layer 140 may penetrate the second compound semiconductor layer 130, so as to be in contact with the protrusion 126.

According to embodiments of the inventive concept, a 2DEG region, formed in an interface between the second and first compound semiconductor layers 130 and 120, may be divided into two separate regions under the gate electrode 151 by the protrusion 126 and the portion of the gate insulating layer 140 filling the region between the second compound semiconductor layer 130 and the protrusion 126. As a result, the hetero junction field effect transistor may maintain a normally off-state condition in the state where a voltage is not applied to the gate electrode 151. According to embodiments of the inventive concept, a width W2 of the protrusion 126 may advantageously be substantially equal to or less than half of a width W1 of the gate electrode 151. Since the 2DEG region is divided into the two separate regions by a relatively narrow protrusion region, a resistance when an on-voltage is applied (e.g., an on-resistance) may be reduced. According to embodiments of the inventive concept, a normally off-state hetero junction field effect transistor may be manufactured without a process of etching the second compound semiconductor layer 130.

Figure 10:
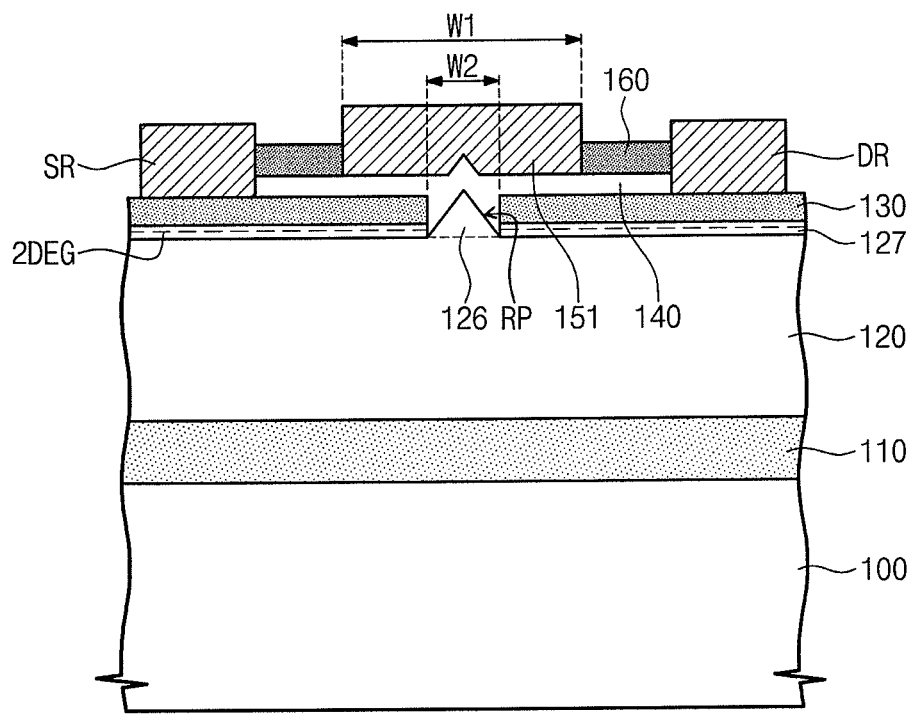
FIG. 10 is a schematic cross-sectional view illustrating a hetero junction field effect transistor according to still other embodiments of the inventive concept.

FIG. 10 is a schematic cross-sectional view illustrating a hetero junction field effect transistor according to still other embodiments of the inventive concept. The descriptions relating to the duplicated elements (i.e., elements already described above) will be omitted or mentioned only briefly for the purpose of ease and convenience in explanation.

In the FIG. 10 embodiment, a third compound semiconductor layer 127 may be formed on the first compound semiconductor layer 120 after the formation of the protrusion 126, but before the formation of the second compound semiconductor layer 130. The third compound semiconductor layer 127 may include the same material as the first compound semiconductor layer 120. In an embodiment, a homo-epitaxial growth process may be performed on the first compound semiconductor layer 120 to form the third compound semiconductor layer 127. The third compound semiconductor layer 127 may be in contact with the subsequently formed second compound semiconductor layer 130. A 2DEG region, as previously described, may be provided in the third compound semiconductor layer 127.

The hetero junction field effect transistors in the aforementioned embodiments may be encapsulated using various packaging techniques. For example, the hetero junction field effect transistors according to the aforementioned embodiments may be encapsulated using any one of the following encapsulation techniques: a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

As described above, the embodiments of the inventive concept may provide hetero junction field effect transistors capable of reducing the dispersion of the on-resistance and the dispersion of the threshold voltage. Additionally, hetero junction field effect transistors of the normally off-state condition may be easily manufactured.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and the described embodiments should not be construed to limit the scope of this invention.

What is claimed is:

1. A hetero junction field effect transistor comprising:
   a first compound semiconductor layer on a substrate, the first compound semiconductor layer having a V shape recess region on an upper portion of the first compound semiconductor layer;
   a second compound semiconductor layer on the first compound semiconductor layer;
   a gate insulating layer on the second compound semiconductor layer; and
   a gate electrode on the gate insulating layer,
   wherein the gate insulating layer includes a first portion in the V shape recess region and having a V shape, a second portion on the second compound semiconductor layer and having a horizontal line shape, and a third portion between the first and second portions and extending in a direction perpendicular to a top surface of the substrate;
   wherein the gate insulating layer is in contact with the first compound semiconductor layer;
   wherein a 2-dimensional electron gas (2DEG) region is provided in an upper portion of the first compound semiconductor layer in a state where a voltage is not applied to the gate electrode; and
   wherein the 2DEG region is not provided under a contacting portion of the gate insulating layer and the first compound semiconductor layer.

2. The hetero junction field effect transistor of claim 1, wherein a surface of the first compound semiconductor layer, which is in contact with the gate insulating layer, exposes a R-plane that is inclined relative to a top surface of the substrate.

3. The hetero junction field effect transistor of claim 1,
   wherein the V shape recess region on an upper portion of the first compound semiconductor layer extends under the gate electrode; and
   wherein the gate insulating layer extends into the recess region.

4. The hetero junction field effect transistor of claim 3, wherein a sidewall of the first compound semiconductor layer, which defines the recess region, exposes a R-plane that is inclined relative to a top surface of the substrate.

5. The hetero junction field effect transistor of claim 3,
   wherein a width of the V-shaped recess region is substantially equal to or less than half of a width of the gate electrode.

6. The hetero junction field effect transistor of claim 1, wherein the third portion has a vertical line shape.

* * * * *